US009530666B2

(12) United States Patent
Mizuno et al.

(10) Patent No.: US 9,530,666 B2
(45) Date of Patent: Dec. 27, 2016

(54) PLASMA ETCHING METHOD AND PLASMA ETCHING APPARATUS

(71) Applicant: Tokyo Electron Limited, Tokyo (JP)

(72) Inventors: Hideki Mizuno, Boise, ID (US); Kumiko Yamazaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/428,817

(22) PCT Filed: Sep. 17, 2013

(86) PCT No.: PCT/JP2013/075026
§ 371 (c)(1),
(2) Date: Mar. 17, 2015

(87) PCT Pub. No.: WO2014/046083
PCT Pub. Date: Mar. 27, 2014

(65) Prior Publication Data
US 2015/0235861 A1  Aug. 20, 2015

Related U.S. Application Data

(60) Provisional application No. 61/703,952, filed on Sep. 21, 2012.

(30) Foreign Application Priority Data

Sep. 18, 2012  (JP) .................................. 2012-204866

(51) Int. Cl.
*H01L 21/311* (2006.01)
*H01L 21/02* (2006.01)
(Continued)

(52) U.S. Cl.
CPC .... *H01L 21/31116* (2013.01); *H01J 37/32889* (2013.01); *H01J 37/32917* (2013.01);
(Continued)

(58) Field of Classification Search
CPC ............. H01L 21/3065; H01L 21/3086; H01L 21/31116; H01L 21/31138; H01L 21/32137
See application file for complete search history.

(56) References Cited

U.S. PATENT DOCUMENTS 6,284,666 B1 * 9/2001 Naeem ................ H01L 21/3081
257/E21.218
7,547,636 B2   6/2009 Chi
(Continued)

FOREIGN PATENT DOCUMENTS

| JP | 2007-129260 A | 5/2007 |
| JP | 2007-235135 A | 9/2007 |
| WO | 94/14187 A1 | 6/1994 |

OTHER PUBLICATIONS

International Search Report for PCT/JP2013/075026 dated Dec. 10, 2013.

*Primary Examiner* — Savitr Mulpuri
(74) *Attorney, Agent, or Firm* — Pearne & Gordon LLP (57) ABSTRACT

A plasma etching method includes a first process and a second process. In the first process, a hole is formed in a processing target film formed on a substrate accommodated within a processing chamber by performing an etching process of etching the processing target film. In the second process, a removing process, a deposition process and an extending process are repeatedly performed. In the removing process, a reaction product adhering to an inlet portion of the hole which is formed through the etching process is removed. In the deposition process, a deposit is deposited on a sidewall of the hole from which the reaction product is
(Continued)

removed through the removing process. In the extending process, the hole, in which the deposit is deposited on the sidewall thereof through the deposition process, is deeply etched by performing the etching process.

17 Claims, 7 Drawing Sheets (51) Int. Cl.
*H01L 21/67* (2006.01)
*H01J 37/32* (2006.01)
*H01L 21/3213* (2006.01)
*H01L 21/3065* (2006.01)
*H01L 21/308* (2006.01)

(52) U.S. Cl.
CPC .... *H01L 21/02263* (2013.01); *H01L 21/3065* (2013.01); *H01L 21/3086* (2013.01); *H01L 21/32137* (2013.01); *H01L 21/67069* (2013.01); *H01J 2237/332* (2013.01); *H01J 2237/334* (2013.01)

(56) References Cited

U.S. PATENT DOCUMENTS

| | | | | |
|---|---|---|---|---|
| 7,622,394 B2* | 11/2009 | Ikegami | ............ | B81C 1/00063 438/719 |
| 7,728,252 B2* | 6/2010 | Morikawa | ............ | B81C 1/00595 118/723 I |
| 7,829,465 B2* | 11/2010 | Lai | ............ | B81C 1/00626 438/694 |
| 7,981,763 B1* | 7/2011 | van Schravendijk | .... | H01L 21/02274 257/E21.546 |
| 8,404,590 B2* | 3/2013 | Lee | ............ | H01L 21/31116 257/E21.09 |
| 8,449,785 B2* | 5/2013 | Kondo | ............ | H01L 21/0332 216/41 |
| 8,485,127 B2* | 7/2013 | Nishimoto | ............ | 118/715 |
| 8,716,144 B2* | 5/2014 | Uda | ............ | H01L 21/3065 438/734 |
| 8,951,915 B2* | 2/2015 | Hess | ............ | H01L 21/30655 257/E29.002 |
| 9,018,079 B1* | 4/2015 | Lei | ............ | H01L 21/82 438/462 |
| 9,165,784 B2* | 10/2015 | Nishimura | ............ | H01L 21/31116 |
| 9,293,346 B2* | 3/2016 | Takaba | ............ | H01L 21/0276 |
| 2002/0179570 A1* | 12/2002 | Mathad | ............ | H01L 21/3065 216/67 |
| 2004/0147090 A1* | 7/2004 | Kim | ............ | H01L 21/76232 438/424 |
| 2007/0202700 A1 | 8/2007 | Leucke | | |
| 2009/0162553 A1* | 6/2009 | Romano | ............ | G03F 7/40 427/282 |

* cited by examiner

| | C4F6/Ar | CHF3/Ar | |
|---|---|---|---|
| | 15mT,300-0,60sec | 15mT,300-0,120sec | 15mT,300-0, 120sec,+COS |
| INLET PORTION OF HOLE |  |  |  |
| BOTTOM PORTION OF HOLE |  |  |  |
| Depo Rate flat | 87.6 | 12.95 | 13.95 |
| Depo Rate neck | 53.7 | 11.7 | 12.2 |
| Depo(neck/flat) | 0.61 | 0.90 | 0.87 |
| Neck position | 55.7 | 103.5 | 78.6 |
| Depo Rate Btm | 20 | 4 | 13.5 |

| | COMPARATIVE EXAMPLE | EXPERIMENTAL EXAMPLE |
|---|---|---|
| IMAGE | | |
| Bowing CD(nm) | 66.3 | 62.0 |
| Btm CD(nm) | 31.4 | 35.0 |

PLASMA ETCHING METHOD AND PLASMA ETCHING APPARATUS

CROSS-REFERENCE TO RELATED APPLICATION

This Application is a U.S. national phase application under 35 U.S.C. §371 of PCT Application No. PCT/JP2013/075026 filed on Sep. 17, 2013, which claims the benefit of Japanese Patent Application No. 2012-204866 filed on Sep. 18, 2012, and U.S. Provisional Application Ser. No. 61/703,952 filed on Sep. 21, 2012, the entire disclosures of which are incorporated herein by reference.

TECHNICAL FIELD

The embodiments described herein pertain generally to a plasma etching method and a plasma etching apparatus.

BACKGROUND ART

Conventionally, there is known a technique of forming a hole in a processing target film by performing an etching process of etching the processing target film formed on a substrate. In this technique, the hole is extended, i.e., deeply etched, by performing the etching process. As the etching process progresses, however, a reaction product adheres to an inlet portion of the hole cumulatively. As a result, necking, which refers to a phenomenon by which the inlet portion of the hole is clogged with the reaction product, may occur.

To solve the problem, there is proposed a technique of removing the reaction product, which adheres to the inlet portion of the hole, in the middle of the etching process. For example, Patent Document 1 describes a technique of repeating a series of processes of stopping the etching process temporarily, selectively removing the reaction product adhering to the inlet portion of the hole, and then, resuming the etching process.

Patent Document 1: U.S. Pat. No. 7,547,636

DISCLOSURE OF THE INVENTION

Problems to be Solved by the Invention

However, as in the conventional method, if the reaction product adhering to the inlet portion of the hole is removed while the etching process progresses, there may occur a bowing by which a sidewall of the hole is narrowed as the etching process is performed. Accordingly, a shape of the hole is degraded.

Means for Solving the Problems

In one example embodiment, a plasma etching method includes a hole forming process, a removing process, a deposition process, and an extending process. In the hole forming process, a hole is formed in a processing target film formed on a substrate accommodated within a processing chamber by performing an etching process of etching the processing target film. In the removing process, a reaction product adhering to an inlet portion of the hole which is formed through the etching process is removed. In the deposition process, a deposit is deposited on a sidewall of the hole from which the reaction product is removed through the removing process. In the extending process, the hole, in which the deposit is deposited on the sidewall thereof through the deposition process, is deeply etched by performing the etching process. Further, the removing process, the deposition process and the extending process are repeatedly performed.

Effect of the Invention

In accordance with the various aspects and embodiments, it is possible to provide a plasma etching method and a plasma etching apparatus capable of improving a hole shape.

DETAILED DESCRIPTION

In the following, example embodiments will be described in detail, and reference is made to the accompanying drawings, which form a part of the description. In the specification and the drawings, parts having substantially the same functions and configurations will be assigned like reference numerals, and redundant description will be omitted.

In one example embodiment, a plasma etching method includes a hole forming process of forming a hole in a processing target film formed on a substrate accommodated within a processing chamber by performing an etching process of etching the processing target film; a removing process of removing a reaction product adhering to an inlet portion of the hole which is formed through the etching process; a deposition process of depositing a deposit on a sidewall of the hole from which the reaction product is removed through the removing process; and an extending process of deeply etching the hole, in which the deposit is deposited on the sidewall thereof through the deposition process, by performing the etching process. Further, the removing process, the deposition process, and the extending process are repeatedly performed multiple times.

In the removing process, the reaction product may be removed by supplying a CF-based gas into the processing chamber and exciting the CF-based gas into plasma. Further, in the deposition process, the deposit may be deposited on the sidewall of the hole by supplying a deposition gas into the processing chamber during a CF-based gas remaining time period during which the CF-based gas supplied in the removing process is left in the processing chamber and exciting the deposition gas into plasma. Furthermore, in the extending process, the hole may be extended by performing the etching process during the CF-based gas remaining time period.

The deposition gas may contain $CHF_3$ and Ar.

The deposition gas may further contain COS.

A processing time of the deposition process may be set to be equal to or less than 10 seconds.

The removing process, the deposition process and the extending process may be repeatedly performed at least eight times.

In another example embodiment, a plasma etching apparatus includes a processing chamber configured to accommodate a substrate therein; a gas supply unit configured to supply a processing gas into the processing chamber; and a control unit configured to form a hole in a processing target film formed on the substrate accommodated within the processing chamber by performing an etching process of etching the processing target film, and configured to repeatedly perform multiple times a removing process of removing a reaction product adhering to an inlet portion of the hole which is formed through the etching process; a deposition process of depositing a deposit on a sidewall of the hole from which the reaction product is removed through the removing process; and an extending process of deeply etching the hole, in which the deposit is deposited on the sidewall thereof through the deposition process, by performing the etching process.

In the removing process, the reaction product may be removed by supplying a CF-based gas into the processing chamber and exciting the CF-based gas into plasma. Further, in the deposition process, the deposit may be deposited on the sidewall of the hole by supplying a deposition gas into the processing chamber during a CF-based gas remaining time period during which the CF-based gas supplied in the removing process is left in the processing chamber and exciting the deposition gas into plasma. Furthermore, in the extending process, the hole may be extended (deeply etched) by performing the etching process during the CF-based gas remaining time.

Figure 1:
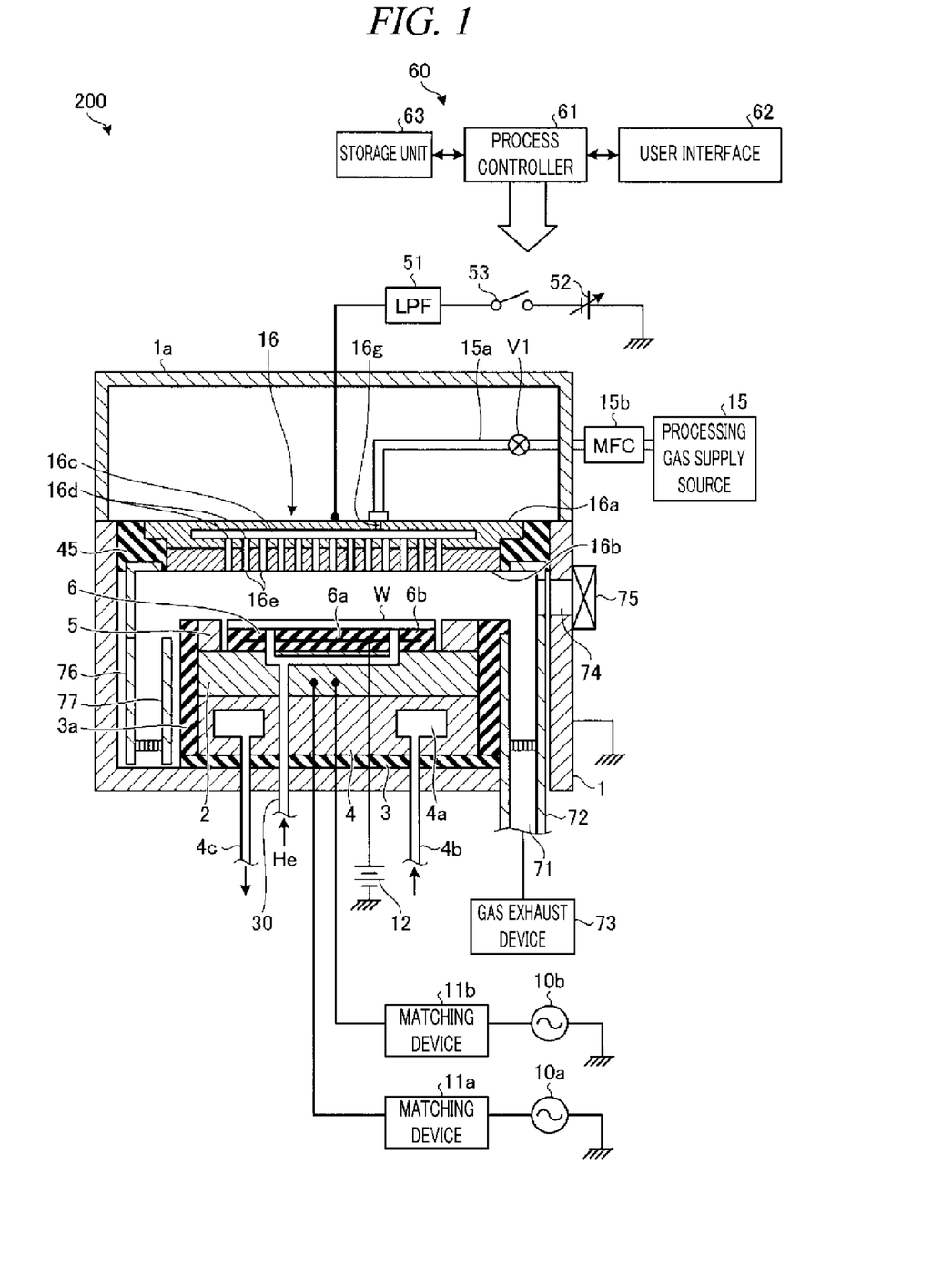
FIG. 1 is an explanatory diagram schematically illustrating a substrate processing system in accordance with an example embodiment.

FIG. 1 is a diagram schematically illustrating a configuration of a plasma etching apparatus in accordance with an example embodiment. The plasma etching apparatus 200 includes a processing chamber 1 which is hermetically sealed and electrically grounded. This processing chamber 1 is of a cylindrical shape and is made of, but not limited to, aluminum having an anodically oxidized surface.

A mounting table 2 configured to support thereon a semiconductor wafer W as a processing target substrate horizontally is provided within the processing chamber 1. The mounting table 2 is made of, but not limited to, aluminum having an anodically oxidized surface and serves as a lower electrode. The mounting table 2 is held on a conductive supporting table 4 with an insulating plate 3 therebetween. Further, a focus ring 5 made of, but not limited to, single crystalline silicon is provided on a periphery of a top surface of the mounting table 2. Also, a cylindrical inner wall member 3a made of, by way of non-limiting example, quartz is provided to surround the mounting table 2 and the supporting table 4.

The mounting table 2 is connected with a first high frequency power supply 10a via a first matching device 11a and, also, with a second high frequency power supply 10b via a second matching device 11b. A high frequency power of a preset frequency (equal to or higher than 27 MHz, e.g., 40 MHz) for plasma generation is applied from the first high frequency power supply 10a to the mounting table 2. A high frequency power of a preset frequency (equal to or lower than 13.56 MHz, e.g., 2 MHz) for ion attraction (bias), which is lower than that of the first high frequency power supply 10a, is applied from the second high frequency power 10b to the mounting table 2. Meanwhile, a shower head 16 serving as an upper electrode is provided above the mounting table 2, facing the mounting table 2 in parallel. The shower head 16 and the mounting table 2 are configured to serve as a pair of electrodes (upper electrode and lower electrode).

An electrostatic chuck 6 configured to attract and hold the semiconductor wafer W electrostatically is provided on the top surface of the mounting table 2. The electrostatic chuck 6 includes an electrode 6a embedded in insulators 6b, and the electrode 6a is connected with a DC power supply 12. While a DC voltage from the DC power supply 12 is applied to the electrode 6a, the semiconductor wafer W is attracted to and held on the electrostatic chuck 6 by a Coulomb force or the like.

A coolant path 4a is formed within the supporting table 4, and a coolant inlet line 4b and a coolant outlet line 4c are connected to the coolant path 4a. By circulating an appropriate coolant, e.g., cooling water within the coolant path 4a, the supporting table 4 and the mounting table 2 can be controlled to have a preset temperature. Further, a backside gas supply line 30 configured to supply a cold heat transfer gas (backside gas) such as a helium gas to a rear side of the semiconductor wafer W is provided to penetrate the mounting table 2. The backside gas supply line 30 is connected to a non-illustrated backside gas supply source. With this configuration, the semiconductor wafer W attracted to and held on the electrostatic chuck 6 on the top surface of the mounting table 2 can be controlled to have a preset temperature.

The shower head 16 is provided at a ceiling portion of the processing chamber 1. The shower head 16 includes a main body 16a; and a top plate 16b forming an electrode plate. The shower head 16 is fastened to an upper portion of the processing chamber 1 with an insulating member 45 therebetween. The main body 16a is made of a conductive material such as, but not limited to, aluminum having an anodically oxidized surface and is configured to hold the top plate 16b from the bottom thereof in a detachable manner.

A gas diffusion space 16c is formed within the main body 16a, and a multiple number of gas discharge holes 16d are formed in a bottom portion of the main body 16a to be located under the gas diffusion space 16c. Also, gas through holes 16e are formed through the top plate 16b in a thickness direction thereof to communicate with the gas discharge holes 16d. With this configuration, a processing gas supplied into the gas diffusion space 16c is introduced into the processing chamber 1 through the gas discharge holes 16d and the gas through holes 16e in a distributed manner as in a shower device. Further, a non-illustrated pipeline configured to circulate a coolant is provided in the main body 16a or the like, and the shower head 16 can be cooled to have a required temperature during a plasma etching process.

The main body 16a has a gas inlet opening 16g through which the processing gas is introduced into the gas diffusion space 16c. One end of a gas supply line 15a is connected to the gas inlet opening 16g, and the other end of the gas supply line 15a is connected with a processing gas supply source 15 configured to supply the processing gas for plasma etching.

The processing gas supply line 15a is equipped with a mass flow controller (MFC) 15b and an opening/closing valve V1 that are arranged in sequence from the upstream side thereof. By way of example, Ar, $O_2$, $C_4F_8$, HBr, $NF_3$, $C_4F_6$, $CF_4$ or the like is supplied into the gas diffusion space 16c through the gas supply line 15a as the processing gas for plasma etching, and, then, is supplied into the processing chamber 1 from the gas diffusion space 16c through the gas discharge holes 16d and the gas through holes 16e in a distributed manner as in a shower device.

In the present example embodiment, the processing gas supply source 15 is configured to supply a CF-based gas as an etching gas for an etching process. The CF-based gas may be, but not limited to, at least one of $C_4F_6$ and $C_4F_8$. Further, the processing gas supply source 15 also is configured to supply a CF-based gas as a gas for a deposit removing process. This CF-based gas may be, but not limited to, at least one of $C_4F_6$ and $C_4F_8$. Also, the processing gas supply source 15 is configured to supply a deposition gas for a deposition process. The deposition gas may be, but not limited to, $CHF_3$ and Ar, or $CHF_3$, Ar and COS. Further, the processing gas supply source 15 also is configured to supply various other gases (e.g., an $O_2$ gas or the like) for various processes performed in the plasma etching apparatus 200. The processing gas supply source 15 is an example of a gas supply unit.

The aforementioned shower head 16 serving as the upper electrode is electrically connected with a variable DC power supply 52 via a low pass filter (LPF) 51. The variable DC power supply 52 is powered on and off by an on/off switch 53. An electric current and a voltage of the variable DC power supply 52 and an on/off operation of the on/off switch 53 are controlled by a control unit 60 to be described later. Further, as will be described later, when plasma is generated within a processing space by applying the high frequency powers from the first and second high frequency power supplies 10a and 10b to the mounting table 2, the on/off switch 53 is turned on by the control unit 60 and a preset DC voltage is applied to the shower head 16 as the upper electrode, if necessary.

A cylindrical grounding conductor 1a is extended from a sidewall of the processing chamber 1 to a position higher than the shower head 16. This cylindrical grounding conductor 1a has a top plate at a top portion thereof.

A gas exhaust opening 71 is formed at a bottom portion of the processing chamber 1, and a gas exhaust device 73 is connected to the gas exhaust opening 71 via a gas exhaust line 72. The gas exhaust device 73 has a vacuum pump, and is configured to decompress the inside of the processing chamber 1 to a preset vacuum level by operating the vacuum pump. Meanwhile, a loading/unloading opening 74 for the wafer W is formed at the sidewall of the processing chamber 1, and a gate valve 75 that opens and closes the loading/unloading opening 74 is provided at the loading/unloading opening 74.

In the drawing, reference numerals 76 and 77 denote detachable deposition shields. The deposition shield 76 is provided along an inner wall surface of the processing chamber 1 to cover the inner wall surface, and the deposition shield 77 is provided to surround the supporting table 4 and the mounting table 2. The deposition shields 76 and 77 are configured to suppress an etching byproduct (deposit) from adhering to the inner wall surface of the processing chamber 1 or the like.

Further, the plasma etching apparatus 200 includes the control unit 60. An overall operation of the plasma etching apparatus 200 having the above-described configuration is controlled by the control unit 60. The control unit 60 includes a process controller 61 having a CPU and configured to control individual components of the plasma etching apparatus; a user interface 62; and a storage unit 63.

The user interface 62 includes a keyboard through which a process manager inputs commands to manage the plasma etching apparatus 200; a display that visually displays an operational status of the plasma etching apparatus 200; and so forth.

The storage unit 63 stores therein control programs (software) for implementing various processes performed in the plasma etching apparatus 200 under the control of the process controller 61 or recipes including processing condition data. In response to an instruction from the user interface 62, a necessary recipe is retrieved from the storage unit 63 and executed by the process controller 61, so that a desired process is performed in the plasma etching apparatus 200 under the control of the process controller 61. Further, the control programs or the recipes including the processing condition data may be used while being stored in a computer-readable computer storage medium (e.g., a hard disk, a CD, a flexible disk, a semiconductor memory, etc.), or may be used on-line by being received from another apparatus through, for example, a dedicated line, whenever necessary.

By way of example, the control unit 60 controls the individual components of the plasma etching apparatus 200 to perform a plasma etching method to be described later. To elaborate, the control unit 60 performs an etching process of etching a processing target film formed on a substrate to form a hole in the processing target film. Then, the control unit 60 repeats multiple times a process of removing a reaction product adhering to an inlet portion of the hole, a process of depositing a deposit on a sidewall of the hole from which the reaction product is removed, and a process of extending (deeply etching) the hole by performing the etching process on the hole in which the deposit is deposited on the sidewall thereof. Here, the substrate is, for example, a semiconductor wafer W, and the processing target film is, for example, an oxide film such as a TEOS film.

Now, a plasma etching method in accordance with the present example embodiment will be explained. Here, a sequence of plasma-etching an oxide film formed on a semiconductor wafer W in the plasma etching apparatus 200 shown in FIG. 1 will be described. First, the gate valve 75 is opened, and the semiconductor wafer W is loaded into the processing chamber 1 through the loading/unloading opening 74 by a non-illustrated transfer robot or the like via a non-illustrated load lock chamber, and, then, mounted on the mounting table 2. Then, the transfer robot is retreated out of the processing chamber 1 and the gate valve 75 is closed. Then, the inside of the processing chamber 1 is evacuated through the gas exhaust opening 71 by the vacuum pump of the gas exhaust device 73.

After the inside of the processing chamber 1 reaches a preset vacuum level, a preset processing gas (etching gas) is introduced into the processing chamber 1 from the processing gas supply source 15, and the inside of the processing chamber 1 is maintained at a certain pressure, e.g., 15 mTorr. In this state, a high frequency power of a frequency of, e.g., 40 MHz is applied from the first high frequency power supply 10a to the mounting table 2. Further, a high frequency power (for bias) of a frequency of, e.g., 2.0 MHz, for ion attraction is also applied from the second high frequency power 10b to the mounting table 2. At this time, a preset DC voltage is applied from the DC power supply 12 to the electrode 6a of the electrostatic chuck 6, and the semiconductor wafer W is attracted to and held on the electrostatic chuck 6 by a Coulomb force.

Here, while the high frequency powers are applied to the mounting table 2 as the lower electrode as stated above, an electric field is formed between the shower head 16 serving as the upper electrode and the mounting table 2 serving as the lower electrode. An electric discharge occurs in the processing space where the semiconductor wafer W is provided, and the oxide film formed on the semiconductor wafer W is etched by plasma of the processing gas which is generated by the electric discharge. At this time, the on/off switch 53 is turned on, if necessary, and a preset DC voltage is applied from the variable DC power supply 52 to the shower head 16 serving as the upper electrode.

Then, upon the completion of the above-described plasma etching process, the supply of the high frequency powers, the supply of the DC voltage and the supply of the processing gas are stopped, and the semiconductor wafer W is unloaded from the processing chamber 1 in the reverse order to that described above.

Figure 2:
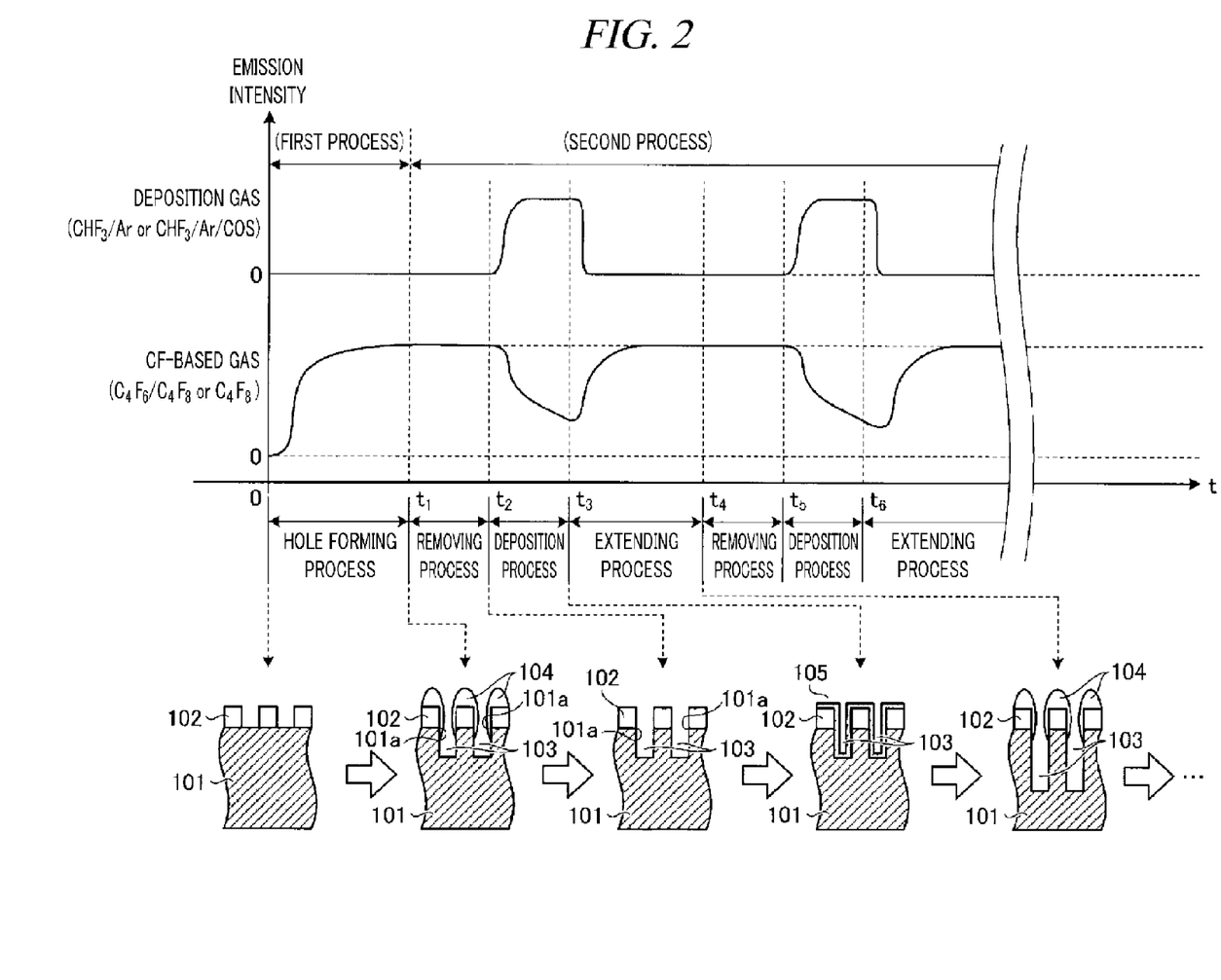
FIG. 2 provides a time chart of respective conditions in a plasma etching method in accordance with the example embodiment and, also, provides diagrams illustrating etching states at respective timings.

Now, the plasma etching method in accordance with the present example embodiment will be described in further detail. FIG. 2 provides a time chart of respective conditions in the plasma etching method in accordance with the example embodiment, and FIG. 2 also provides diagrams illustrating etching states at respective timings. In the example shown in FIG. 2, the semiconductor wafer W, in which a TEOS film 101 as an oxide film is formed thereon and a mask film 102 of a preset pattern is formed on the TEOS film 101, is prepared, and the TEOS film 101 is plasma-etched.

In the plasma etching method in accordance with the present example embodiment, a supply of a CF-based gas as an etching gas and as a deposit removing gas, a supply of a deposition gas for depositing a deposit, and so forth are controlled according to the time chart shown in the upper portion of FIG. 2. On the time chart shown in the upper portion of FIG. 2, a horizontal axis represents an elapsed time, and a vertical axis indicates an emission intensity of plasma of a gas within the processing chamber 1.

First, in the plasma etching method, a hole forming process of forming a hole in the TEOS film 101 by performing an etching process of etching the TEOS film 101 formed on the semiconductor wafer W is performed. To elaborate, at preset time 0, the control unit 60 begins a supply of a CF-based gas as an etching gas and excites the CF-based gas into plasma, as shown in the upper portion of FIG. 2. For example, the control unit 60 may supply a mixture gas of $C_4F_6/C_4F_8$ as the CF-based gas. The hole forming process is an example of a first process.

At time $t_1$ after the lapse of a preset time period from the time 0, the TEOS film 101 is etched and a hole (first hole) 103 is formed, as shown in the lower portion of FIG. 2. Further, a reaction product (deposit) 104 generated as a result of performing the etching process adheres to an inlet portion 101a of the hole 103. At the same time, a necking portion 105a, in which the inlet portion 101a of the hole 103 is clogged with the deposit 104, is formed in the vicinity of an opening of the hole 103. If the etching process progresses in this state, a shape of the hole may be narrowed and a bowing may occur, so that the shape of the hole may be poor.

Then, in the plasma etching method, a removing process of removing the deposit 104 adhering to the inlet portion of the hole 103 is performed. To elaborate, the control unit 60 supplies a CF-based gas as a deposit removing gas continually and excites the CF-based gas into plasma during a period from the time $t_1$ to the time $t_2$, as shown in the upper portion of FIG. 2. For example, the control unit 60 may supply a mixture gas of $C_4F_6/C_4F_8$. Alternatively, the control unit 60 may supply $C_4F_8$ as the CF-based gas. Here, the control unit 60 excites the CF-based gas as the deposit removing gas into plasma by applying a high frequency power lower than a high frequency power for exciting the CF-based gas as the etching gas into plasma.

As stated above, if the CF-based gas as the deposit removing gas is excited into plasma, the deposit 104 adhering to the inlet portion 101a of the hole 103 is removed, as illustrated in the lower portion of FIG. 2. As a result, it is possible to suppress the necking in which the inlet portion of the hole 103 is clogged with the deposit 104, from occurring.

Then, in the plasma etching method, there is performed a deposition process of depositing a deposit 105 on a sidewall of the hole 103 from which the deposit 104 is removed. To elaborate, during a period from the time $t_2$ to the time $t_3$, the control unit 60 stops the supply of the CF-based gas as the deposit removing gas, supplies a deposition gas for depositing a deposit, and then, excites the deposition gas into plasma, as depicted in the upper portion of FIG. 2. For example, the control unit 60 may supply a mixture gas of $CHF_3/Ar$, or a mixture gas of $CHF_3/Ar/COS$.

If the deposition gas is excited into plasma, the deposit 105 is deposited on a surface of the mask film 102 and the sidewall of the hole 103, as illustrated in the lower portion of FIG. 2. The deposit 105 deposited on the sidewall of the hole 103 serves as a protective film having plasma resistance. As a consequence, it is possible to suppress the bowing, in which the sidewall of the hole 103 is narrowed, from occurring. Further, if the mixture gas of $CHF_3/Ar$ or $CHF_3/Ar/COS$ is used as the deposition gas, the deposit 105 is uniformly deposited on the sidewall of the hole 103. A variation of a deposition state of the deposit 105 depending on difference kinds of the deposition gas will be described later in detail.

Further, the control unit 60 supplies the deposition gas and excites the deposition gas into plasma during a CF-based gas remaining time period during which the CF-based gas supplied in the removing process is left in the processing chamber 1. In other words, the control unit 60 supplies the deposition gas and excites the deposition gas into plasma during the period from the time $t_2$ to the time $t_3$ included in the CF-based gas remaining time period during which the CF-based gas is not completely replaced with the deposition gas in the processing chamber 1. The period from the time $t_2$ to the time $t_3$ included in the CF-based gas remaining time period, i.e., a processing time of the deposition process is set to be equal to or less than, e.g., 10 sec. An optimum processing time of the deposition process will be elaborated later.

Subsequently, in the plasma etching method, there is performed an extending process of extending the hole 13, in which the deposit 105 is deposited on the sidewall thereof through the deposition process, by performing the etching process. To elaborate, the control unit 60 stops the supply of the deposition gas, resumes the supply of the CF-based gas as the etching gas, and then, excites the CF-based gas into plasma during a period from the time $t_3$ to the time $t_4$, as depicted in the upper portion of FIG. 2.

At the time $t_4$, the hole 103 is extended (deeply etched), so that a second hole is formed, as depicted in the lower portion of FIG. 2. A sidewall of this hole (second hole) 103 is protected from ions in the plasma by the deposit 105 serving as the protective film. Accordingly, it is possible to suppress the bowing from occurring.

Further, the control unit 60 supplies the CF-based gas as the etching gas and excites the CF-based gas into plasma during the CF-based gas remaining time period. In other words, the control unit 60 supplies the CF-based gas as the etching gas and excites the CF-based gas into plasma during the period from time $t_3$ to time $t_4$ included in the CF-based gas remaining time period during which the CF-based gas is not completely replaced with the deposition gas in the processing chamber 1. Here, the high frequency power used to excite the CF-based gas as the etching gas into plasma is higher than a high frequency power for exciting the deposition gas into plasma. Since the control unit 60 excite the CF-based gas into plasma during the CF-based gas remaining time period during which the CF-based gas within the processing chamber 1 is not completely replaced with the deposition gas, it is possible to suppress the deposition gas from being excited into plasma by a surplus high frequency power. As a result, it is possible to suppress the bowing caused by collision of ions in the plasma of the deposition gas with the sidewall of the hole 103 from occurring.

Thereafter, in the plasma etching method, the removing process, the deposition process and the extending (deep-etching) process are repeated multiple times. The removing process, the deposition process and the extending (deep-etching) process are an example of a second process.

As stated above, in the plasma etching method in accordance with the present example embodiment, by performing the removing process, the deposition process and the extending (deep-etching) process repeatedly after the hole forming process, a deposit having plasma resistance can be deposited on the sidewall of the hole while removing a deposit which has adhered to the inlet portion of the hole during the etching process. Thus, according to the plasma etching method in accordance with the example embodiment, the necking and the bowing of the hole can be suppressed. As a result, in the plasma etching method in accordance with the example embodiment, a hole shape can be improved, as compared to a conventional technique of merely removing the deposit adhering to the inlet portion of the hole during the etching process.

Further, in the plasma etching method in accordance with the example embodiment, by supplying the deposition gas into the processing chamber 1 and exciting the deposition gas into plasma during the CF-based gas remaining time period, the deposit is deposited on the sidewall of the hole. Also, in the plasma etching method in accordance with the example embodiment, by performing the etching process during the CF-based gas remaining time period, the hole is extended (deeply etched). Accordingly, in the plasma etching method of the example embodiment, since the CF-based gas can be excited into plasma during the CF-based gas remaining time period during which the CF-based gas within the processing chamber 1 is not completely replaced with the deposition gas, it is possible to suppress the deposition gas from being excited into plasma by a surplus high frequency power. Consequently, it is possible to suppress the bowing caused by the collision of the ions in the plasma of the deposition gas with the sidewall of the hole from occurring.

Figure 3:
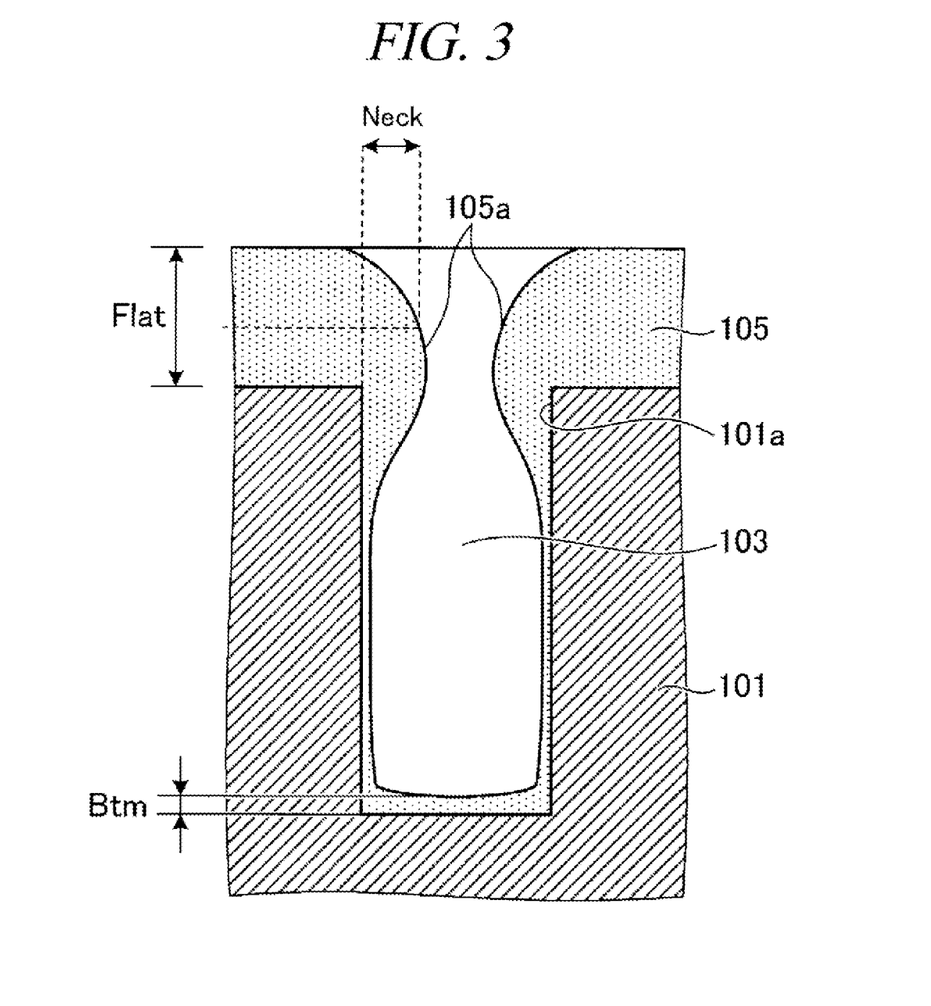
FIG. 3 is a diagram for defining names of individual portions of a deposit in the example embodiment.

Now, a variation in the deposition state of the deposit 105 depending on different kinds of the deposition gas in the example embodiment will be elaborated. Here, prior to describing the variation in the deposition state of the deposit 105, names of individual portions of the deposit will be first defined. FIG. 3 is a diagram for defining the names of the individual portions of the deposit in accordance with the present example embodiment. By way of example, a Flat portion of the deposit 105 refers to, as shown in FIG. 3, a portion ranging from a surface of the TEOS film 101 (or the mask film 102) to an endmost portion of the deposit 105 in a vertical direction. A "Neck" portion of the deposit 105 refers to a portion ranging from a side surface of the hole 103 to an endmost portion of the deposit 105 in a horizontal direction. Further, for example, a "Btm" portion of the deposit 105 refers to a portion ranging from a bottom portion of the hole 103 to the end portion of the deposit 105 formed thereon in the vertical direction.

Figure 4:
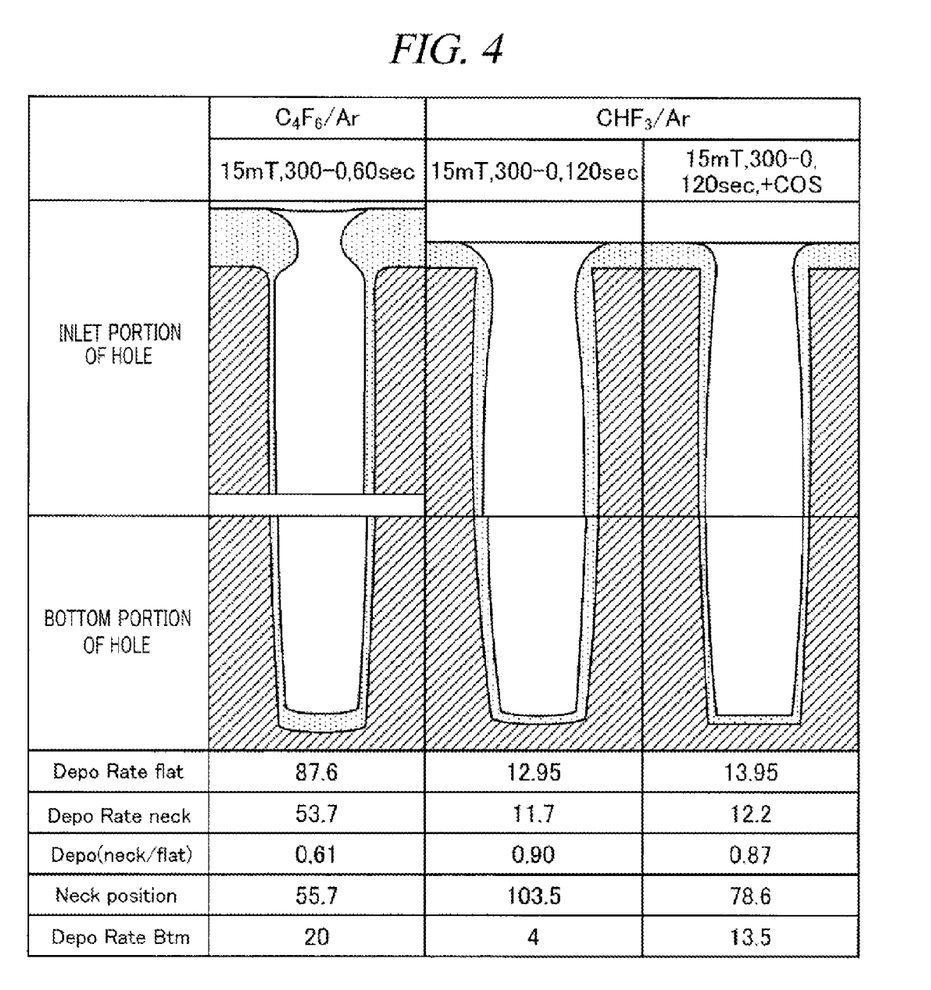
FIG. 4 is a diagram showing a variation in a deposition state of a deposit depending on different kinds of a deposition gas in the example embodiment.

FIG. 4 is a diagram showing a variation in the deposition state of the deposit depending on different kinds of the deposition gas in the present example embodiment. An example shown in a left portion of FIG. 4 indicates deposition states of the deposit 105 (deposition states in the vicinity of the inlet portion and the bottom portion of the hole 103) in case of using $C_4F_6/Ar$ as the deposition gas for the deposition process. Further, an example shown in a middle portion of FIG. 4 indicates deposition states of the deposit 105 (deposition states in the vicinity of the inlet portion and the bottom portion of the hole 103) in case of using $CHF_3/Ar$ as the deposition gas for the deposition process. In addition, an example shown in a right portion of FIG. 4 indicates deposition states of the deposit 105 (deposition states in the vicinity of an inlet portion and a bottom portion of the hole 103) in case of using $CHF_3/Ar/COS$ as the deposition gas for the deposition process. As the other conditions for the deposition process, 15 mT, 300 W to 0 W, 60 sec or 120 sec are used.

In FIG. 4, "Depo Rate flat" indicates a deposition rate (nm/sec) of the Flat portion of the deposit 105, and "Depo Rate neck" represents a deposition rate (nm/sec) of the Neck portion of the deposit 105. Further, "Depo(neck/flat)" indicates "Depo Rate neck"/"Depo Rate flat". As this ratio of "Depo(neck/flat)" approaches 1, it implies that uniformity of the deposit 105 is higher. Further, "Neck position" refers to a distance (mm) from a position of the most protruding portion of the Flat portion of the deposit 105 in the vertical direction to a position of the most protruding portion of the Neck portion of the deposit 105 in the horizontal direction, and a larger value of "Neck position" indicates higher uniformity of the deposit 105. In addition, "Depo Rate Btm" represents a deposition rate (nm/sec) of the Btm portion of the deposit 105.

As depicted in FIG. 4, by using the $CHF_3/Ar$ or $CHF_3/Ar/COS$ as the deposition gas, it is possible to obtain appropriate "Depo(neck/flat)" and "Neck position" values while maintaining the values of "Depo Rate flat" and "Depo Rate neck" low, as compared to the case of using $C_4F_6/Ar$ as the deposition gas. Further, by using $CHF_3/Ar/COS$, it is possible to maintain the values of "Depo Rate flat", "Depo Rate neck" and "Depo Rate Btm" high, as compared to the case of using $CHF_3/Ar$.

As stated above, by using the $CHF_3/Ar$ or $CHF_3/Ar/COS$ as the deposition gas, the shape of the hole can be further improved. That is to say, since a surplus deposit is not deposited in the vicinity of the inlet portion of the hole but the deposit can be uniformly deposited on the sidewall of the hole in the deposition process, the bowing can be suppressed efficiently. As a result, when using the $CHF_3/Ar$ or $CHF_3/Ar/COS$ as the deposition gas in the deposition process, the shape of the hole can be further improved, as compared to the case of using $C_4F_6/Ar$. In addition, when using the $CHF_3/Ar/COS$ as the deposition gas in the deposition process, it is possible to suppress occurrence of the bowing while maintaining an appropriate deposition rate.

Figure 5:
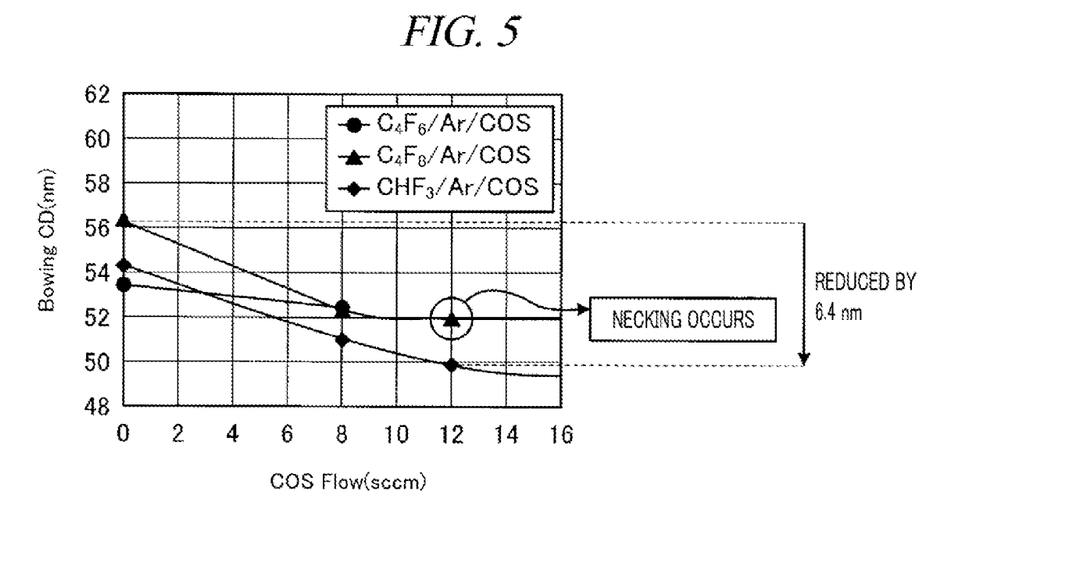
FIG. 5 is a diagram showing a relationship between a bowing and a flow rate of COS (carbonyl sulfide) which is added as a deposition gas.

Here, $CHF_3$ and COS used as the deposition gas for the deposition process will be discussed in further detail. FIG. 5 is a diagram showing a relationship between the bowing and a flow rate (sccm) of the COS added as the deposition gas. In FIG. 5, a horizontal axis represents a flow rate (sccm) of the COS added as a deposition gas and a vertical axis indicates a bowing CD (Critical Dimension) (nm). Here, the bowing CD refers to a diameter of a portion of the hole 103 with the narrowest sidewall. A smaller value of the bowing CD indicates that occurrence of the bowing is suppressed well.

The example depicted in FIG. 5 provides a result obtained when the COS is added to the deposition gas of $C_4F_6/Ar$=15 sccm/300 sccm in the deposition process. Further, the example depicted in FIG. 5 shows a result obtained when the COS is added to the deposition gas of $C_4F_8/Ar$=15 sccm/300 sccm in the deposition process. In addition, the example depicted in FIG. 5 also depicts a result obtained when the COS is added to the deposition gas of $CHF_3/Ar$=100 sccm/300 sccm in the deposition process.

As can be seen from FIG. 5, when performing the deposition process by using the $C_4F_6/Ar$/COS as the deposition gas, the bowing CD decreases continually until the COS flow rate reaches 12 sccm, and if the COS flow rate becomes equal to or higher than 12 sccm, the necking occurs. Further, when performing the deposition process by using the $C_4F_8/Ar$/COS as the deposition gas, the bowing CD decreases continually until the COS flow rate reaches 12 sccm, and if the COS flow rate becomes equal to or higher than 12 sccm, the necking also occurs. Meanwhile, when performing the deposition process by using the $CHF_3/Ar$/COS as the deposition gas, the bowing CD decreases continually until the COS flow rate reaches 12 sccm and even if the COS flow rate becomes equal to or higher than 12 sccm, the necking does not occur and the bowing CD is saturated. In addition, when performing the deposition process by using the $CHF_3/Ar$/COS, the bowing CD is found to be smaller than that in case of performing the deposition process by using the $C_4F_6/Ar$/COS as the deposition gas. In the example depicted in FIG. 5, the bowing CD is decreased by 6.4 nm. As such, a desirable COS gas flow rate is equal to or higher than 9 sccm, and, more desirably, equal to or higher than 10 sccm.

Figure 6:
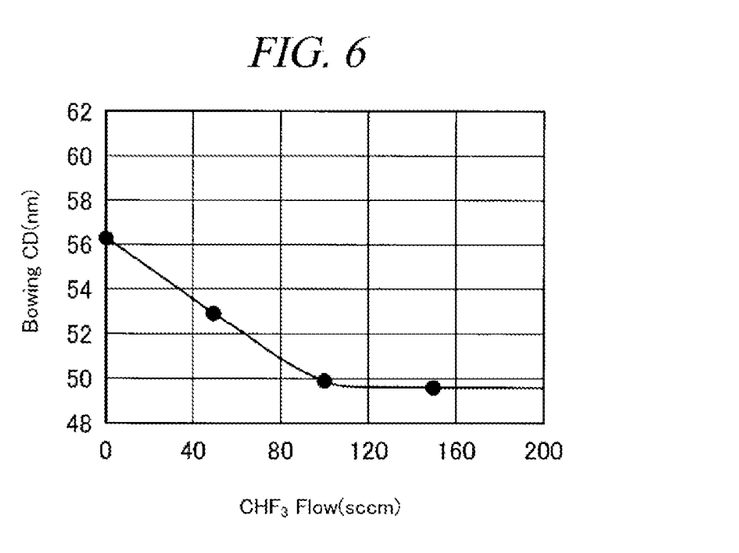
FIG. 6 is a diagram showing a relationship between a bowing and a flow rate of $CHF_3$ which is added as a deposition gas.

FIG. 6 shows a relationship between the bowing and a flow rate of $CHF_3$ added as a deposition gas. In FIG. 6, a horizontal axis represents a flow rate (sccm) of the $CHF_3$ added as the deposition gas, and a vertical axis represents the bowing CD (nm).

The example shown in FIG. 6 shows a result obtained when the $CHF_3$ is added to a deposition gas of Ar/COS=300 sccm/12 sccm in the deposition process.

As shown in FIG. 6, the bowing CD decreases continually until the flow rate of the $CHF_3$ added to the deposition gas reaches 100 sccm, and if the flow rate of the $CHF_3$ added to the deposition gas becomes equal to or higher than 100 sccm, the bowing CD is saturated. Accordingly, a desirable flow rate of the $CHF_3$ gas is equal to or higher than 100 sccm.

As stated above, by performing the deposition process through the use of the deposition gas containing $CHF_3$ and COS, the necking and the bowing of the hole can be suppressed efficiently. As a result, the hole shape can be further improved.

Figure 7:
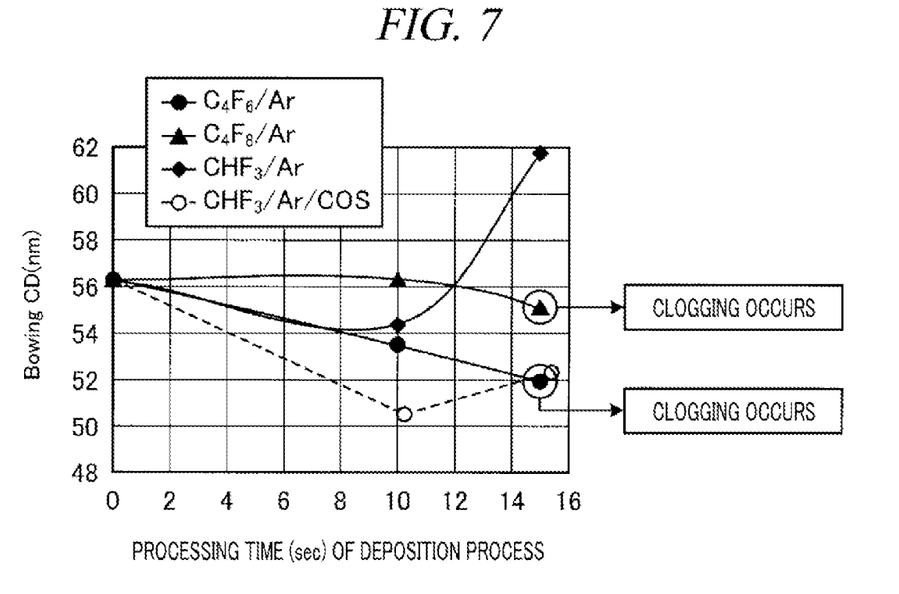
FIG. 7 is a diagram for describing an optimum value of a processing time of a deposition process in the example embodiment.

Now, an optimum value of the processing time of the deposition process in accordance with the present example embodiment will be described in detail. FIG. 7 is a diagram for describing an optimum processing time of the deposition process in the present example embodiment. FIG. 7 shows a relationship between a processing time of the deposition process and the bowing. In FIG. 7, a horizontal axis represents a processing time (sec) of the deposition process, and a vertical axis indicates the bowing CD.

Further, in the example depicted in FIG. 7, a result obtained by performing the deposition process by using the deposition gas of $C_4F_6/Ar$=15 sccm/300 sccm is provided. In addition, in the example shown in FIG. 7, a result obtained by performing the deposition process by using the deposition gas of $C_4F_8/Ar$=15 sccm/300 sccm is also provided. Furthermore, in the example shown in FIG. 7, a result obtained by performing the deposition process by using the deposition gas of $CHF_3/Ar$=100 sccm/300 sccm is also provided. Further, in the example shown in FIG. 7, a result obtained by performing the deposition process by using the deposition gas of $CHF_3/Ar$/COS=100 sccm/300 sccm/12 sccm is also provided.

As can be seen from FIG. 7, in case of performing the deposition process by using the $C_4F_6/Ar$ as the deposition gas, the bowing CD decreases continually until the processing time of the deposition process reaches 10 sec, and if the processing time of the deposition process becomes equal to or longer than 10 sec, a clogging occurs. Further, in case of performing the deposition process by using the $C_4F_8/Ar$ as the deposition gas, the bowing CD decreases continually until the processing time of the deposition process reaches 10 sec, and if the processing time of the deposition process becomes equal to or longer than 10 sec, the clogging occurs.

On the other hand, in case of performing the deposition process by using the $CHF_3/Ar$ as the deposition gas, the bowing CD decreases continually until the processing time of the deposition process reaches 10 sec, and if the processing time of the deposition process exceeds 10 sec, the necking does not occur and the bowing CD also increases. It is deemed to be because, if the processing time of the deposition process exceeds 10 sec, the CF-based gas within the processing chamber 1 is almost completely replaced with the $CHF_3$ as the deposition gas, and the ions in the plasma of the $CHF_3$ gas collide with the sidewall of the hole in the extending process after the deposition process. Further, in case of performing the deposition process by using the $CHF_3/Ar$/COS as the deposition gas, the bowing CD decreases continually until the processing time of the deposition process reaches 10 sec, and if the processing time of the deposition process exceeds 10 sec, the clogging does not occur and the increase of the bowing CD is suppressed. It is deemed to be because a deposit film generated from the COS added to the deposition gas adheres to the sidewall of the hole and this deposit film may suppress the ions in the $CHF_3$ plasma from colliding with the sidewall of the hole in the extending process.

As stated above, it is desirable that the processing time of the deposition process is set to be in the range from 8 sec to 15 sec, and, more desirably, from 9 sec to 12 sec. Most desirably, the processing time of the deposition process is set to be within 10 sec. By setting the processing time of the deposition process to fall within the above-specified range, it is possible to suppress the ions in the plasma of the $CHF_3$ from colliding with the sidewall of the hole in the extending process after the deposition process. As a result, the occurrence of bowing can be suppressed efficiently.

Figure 8:
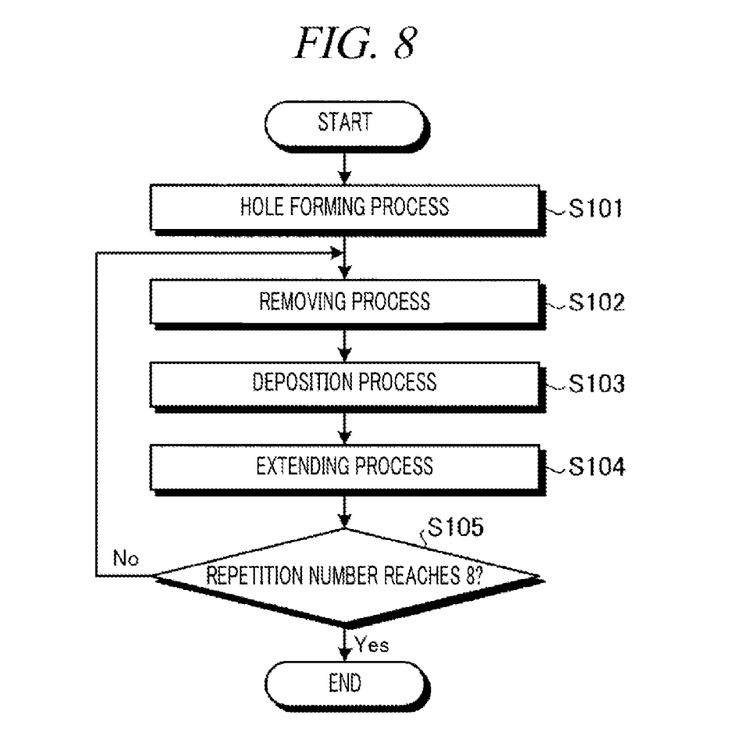
FIG. 8 is a flowchart showing a sequence of the plasma etching method in an experimental example.

Now, an experimental example of the plasma etching method will be explained. FIG. 8 is a flowchart for describing a sequence of the plasma etching method in accordance with the experimental example. In the example depicted in FIG. 8, a semiconductor wafer W, in which a TEOS film 101 as an oxide film is formed thereon and a mask film 102 of a preset pattern is formed on the TEOS film 101, is prepared, and the TEOS film 101 is plasma-etched.

First, in the plasma etching method of the experimental example, the hole forming process is performed (process S101). To elaborate, the control unit 60 supplies a CF-based gas of $C_4F_6/C_4F_8/Ar/O_2$=70 sccm/10 sccm/300 sccm/78 sccm into the processing chamber 1. Then, the control unit 60 excites the $C_4F_6/C_4F_8/Ar/O_2$ into plasma by using the high frequency powers of 2025 W/7800 W for, by way of example, 180 sec. As a result, the hole 103 is formed in the TEOS film 101.

Subsequently, in the plasma etching method according to the experimental example, the removing process is performed (process S102). To elaborate, the control unit 60 supplies a CF-based gas of $C_4F_8/Ar/O_2$=60 sccm/300 sccm/20 sccm into the processing chamber 1. Then, the control unit 60 excites the $C_4F_8/Ar/O_2$ into plasma by using the high frequency powers of 500 W/1500 W for, by way of example, 10 sec. As a result, the deposit 104 adhering to the inlet portion of the hole 103 is removed.

Thereafter, in the plasma etching method in accordance with the experimental example, the deposition process is performed (process S103). To be specific, the control unit 60 supplies a deposition gas of $CHF_3/Ar/COS$=100 sccm/300 sccm/12 sccm into the processing chamber 1. Then, the control unit 60 excites the $CHF_3/Ar/COS$ into plasma by using the high frequency powers of 300 W/0 W for, by way of example 10 sec. As a result, the deposit 105 is deposited on the surface of the mask film 102 and the sidewall of the hole 103.

Next, in the plasma etching method of the experimental example, the extending (deep-etching) process is performed (process S104). Specifically, the control unit 60 supplies a CF-based gas of $C_4F_6/C_4F_8/Ar/O_2$=70 sccm/10 sccm/300 sccm/78 sccm into the processing chamber 1. Then, the control unit 60 excites the $C_4F_6/C_4F_8/Ar/O_2$ into plasma by using the high frequency powers of 2025 W/7800 W for, by way of example, 30 sec. As a result, the hole 103 is extended (deeply etched).

Afterwards, in the plasma etching method of the experimental example, it is determined whether the repetition number of the processes S102 to S104 reaches eight (8) (process S105). If the repetition number does not reach eight (No in process S105), the process returns back to the process S102. Meanwhile, if the repetition number reaches eight (Yes in process S105), the process is ended.

According to the plasma etching method of the experimental example as described above, by repeatedly performing the removing process, the deposition process and the extending (deep-etching) process eight times after the hole forming process, the deposit having plasma resistance is deposited on the sidewall of the hole while removing the deposit adhering to the inlet portion of the hole during the etching process. Accordingly, in the plasma etching method of the experimental example, the necking and the bowing of the hole can be suppressed. As a consequence, the plasma etching method of the experimental example is capable of improving the hole shape, as compared to a conventional technique of just removing the deposit adhering to the inlet portion of the hole during the etching process.

Figure 9:
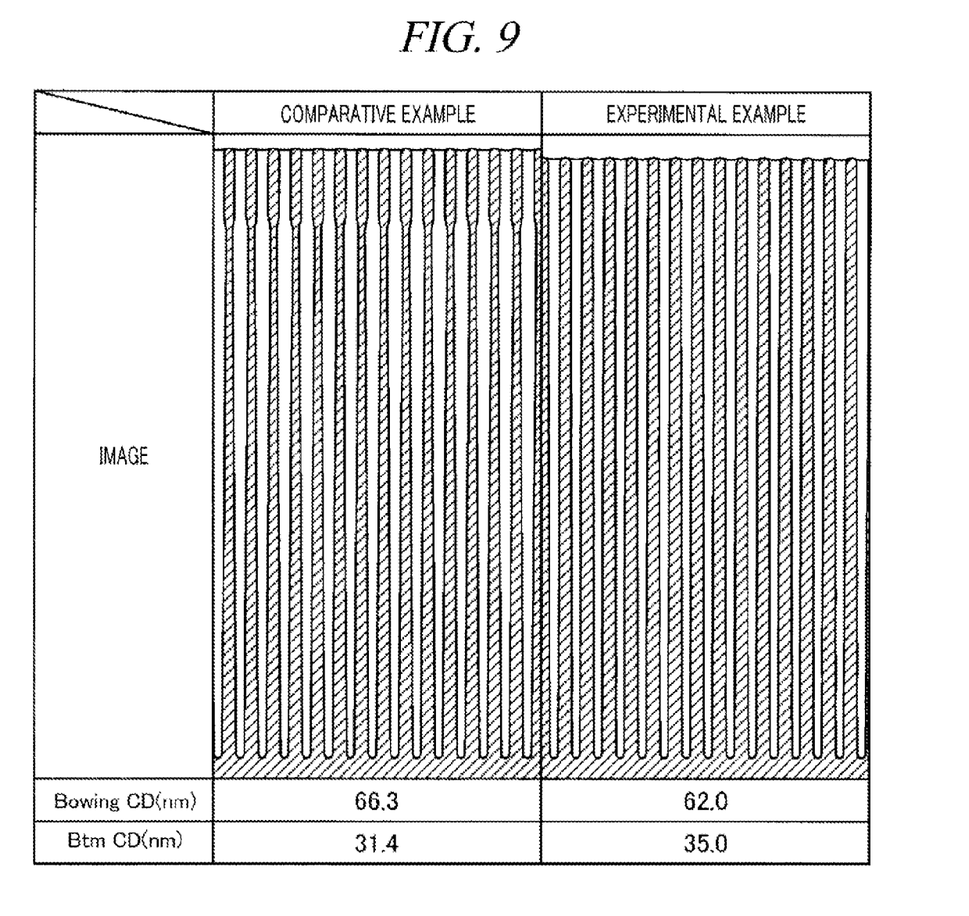
FIG. 9 is a diagram for describing an effect of the plasma etching method in the experimental example.

Now, an effect of the plasma etching method of the experimental example will be explained. FIG. 9 is a diagram for describing an effect of the plasma etching method of the experimental example. An example depicted in a right portion of FIG. 9 shows the hole shape obtained by performing the plasma etching method of the experimental example. Further, an example depicted in a left portion of FIG. 9 shows the hole shape obtained by performing a plasma etching method of a comparative example. In the plasma etching method of the comparative example, $C_4F_6/C_4F_8/Ar/O_2$=70 sccm/10 sccm/300 sccm/78 sccm is supplied into the processing chamber 1, and, then, the $C_4F_6/C_4F_8/Ar/O_2$ is excited into plasma by using the high frequency power of 2025 W/7800 W for, by way of example, 450 sec.

As can be seen from FIG. 9, when performing the plasma etching method of the experimental example, the bowing CD is reduced as compared to that in the case of performing the plasma etching method of the comparative example. Further, when performing the plasma etching method of the experimental example, the bottom CD is increased as compared to that in the case of performing the plasma etching method of the comparative example. That is, the plasma etching method of the experimental example is capable of improving the hole shape by repeatedly performing the removing process, the deposition process and the extending (deep-etching) process eight times after the hole forming process.

EXPLANATION OF REFERENCE NUMERALS

1: Processing chamber
2: Mounting table
15: Processing gas supply source
16: Shower head
10a: First high frequency power supply
10b: Second high frequency power supply
60: Control unit
200: Plasma etching apparatus
W: Semiconductor wafer

We claim:
1. A plasma etching method, comprising:
a hole forming process of forming a hole in a processing target film formed on a substrate accommodated within a processing chamber by performing a first etching process of etching the processing target film;
a removing process of removing a reaction product adhering to an inlet portion of the hole which is formed through the first etching process;
a deposition process of depositing a deposit on a sidewall of the hole from which the reaction product is removed through the removing process; and
an extending process of deeply etching the hole, in which the deposit is deposited on the sidewall thereof through the deposition process, by performing a second etching process,
wherein the removing process, the deposition process, and the extending process are repeatedly performed multiple times,
wherein, in the removing process, the reaction product is removed by supplying a CF-based gas into the processing chamber and exciting the CF-based gas into plasma,
in the deposition process, the deposit is deposited on the sidewall of the hole by supplying a deposition gas into the processing chamber during a CF-based gas remaining time period during which the CF-based gas supplied in the removing process is left in the processing chamber and exciting the deposition gas into plasma, and
in the extending process, the hole is extended by performing the etching process during the CF-based gas remaining time period.

2. The plasma etching method of claim 1,
wherein the deposition gas contains $CHF_3$ and Ar.

3. The plasma etching method of claim 2,
wherein the deposition gas further contains COS.

4. The plasma etching method of claim 1,
wherein a processing time of the deposition process is in a range from 8 seconds to 15 seconds.

5. The plasma etching method of claim 1,
wherein the removing process, the deposition process and the extending process are repeatedly performed at least eight times.

6. A plasma etching method of etching a substrate, which is accommodated within a processing chamber and has a first film and a second film formed under the first film, with an etching gas to form a hole in the second film, the plasma etching method comprising:
loading the substrate having the first film and the second film formed under the first film into the processing chamber;
forming a first hole by performing a first etching process in which the second film is etched by using a first etching gas with the first film as a mask;
forming a reaction product in a vicinity of an opening portion of the first film above the first hole;
removing the reaction product by etching the reaction product with a second etching gas;
depositing a deposit on a sidewall of the first hole by using a third etching gas; and
deeply etching the first hole, in which the deposit is deposited on the sidewall thereof, by performing the first etching process with the first etching gas,
wherein the removing of the reaction product, the depositing of the deposit and the deeply etching of the first hole are repeatedly performed multiple times, and
the third etching gas contains at least $CHF_3$ and COS.

7. The plasma etching method of claim 6,
wherein the first etching gas and the second etching gas-contains a CF-based gas.

8. The plasma etching method of claim 6,
wherein a processing time of the depositing of the deposit is in a range from 8 seconds to 15 seconds.

9. The plasma etching method of claim 1,
wherein an etching gas of the first etching process and a deposit removing gas of the removing process contain a CF-based gas, and exciting the deposit removing gas into plasma is performed by applying a high frequency power lower than a high frequency power for exciting the etching gas into plasma.

10. The plasma etching method of claim 1,
wherein a deposition gas of the deposition process contains a gas containing C, H, and F.

11. The plasma etching method of claim 10,
wherein the deposition gas further contains COS.

12. The plasma etching method of claim 10,
wherein the deposition gas containing C, H and F is CHF3.

13. The plasma etching method of claim 12,
wherein the deposition gas further contains Ar, and a ratio of a flow rate of the CHF3 to a flow rate of the Ar is equal to or higher than ⅓.

14. The plasma etching method of claim 11,
wherein a ratio of a flow rate of the COS to a flow rate the gas containing C, H, and F is equal to or higher than 0.09.

15. The plasma etching method of claim 1,
wherein a deposit removing gas of the removing process contains a CF-based gas, and the deposition process is performed after the removing process during the CF-based gas remaining time period during which the CF-based gas is left in the processing chamber.

16. The plasma etching method of claim 15,
wherein a deposition gas of the deposition process contains a mixture gas of CHF3/Ar or a mixture gas of CHF3/Ar/COS.

17. A plasma etching method, comprising:
a hole forming process of forming a hole in a processing target film formed on a substrate accommodated within a processing chamber by performing a first etching process of etching the processing target film;
a removing process of removing a reaction product adhering to an inlet portion of the hole which is formed through the first etching process;
a deposition process of depositing a deposit on a sidewall of the hole from which the reaction product is removed through the removing process; and
an extending process of deeply etching the hole, in which the deposit is deposited on the sidewall thereof through the deposition process, by performing a second etching process,
wherein a deposit removing gas of the removing process contains a CF-based gas, the reaction product is removed by supplying the CF-based gas into the processing chamber and exciting the CF-based gas into plasma, and the deposition process is performed by supplying a deposition gas into the processing chamber after the removing process during a CF-based gas remaining time period during which the CF-based gas is left in the processing chamber and exciting the deposition gas into plasma, and the extending process of deeply etching the hole is performed by performing the second etching process during the CF-based gas remaining time period.

* * * * *